(12) United States Patent
Provencher et al.

(10) Patent No.: US 10,631,410 B2
(45) Date of Patent: Apr. 21, 2020

(54) STACKED PRINTED CIRCUIT BOARD PACKAGES

(71) Applicant: Apple Inc., Cupertino, CA (US)

(72) Inventors: Corey S. Provencher, Santa Clara, CA (US); Meng Chi Lee, Los Altos, CA (US); Derek J. Walters, San Jose, CA (US); Ian A. Spraggs, San Francisco, CA (US); Flynn P. Carson, Redwood City, CA (US); Shakti S. Chauhan, Cupertino, CA (US); Daniel W. Jarvis, Sunnyvale, CA (US); David A. Pakula, San Francisco, CA (US); Jun Zhai, Cupertino, CA (US); Michael V. Yeh, Cupertino, CA (US); Alex J. Crumlin, San Jose, CA (US); Dennis R. Pyper, San Jose, CA (US); Amir Salehi, Los Gatos, CA (US); Vu T. Vo, Salinas, CA (US); Gregory N. Stephens, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/710,579

(22) Filed: Sep. 20, 2017

(65) Prior Publication Data
US 2018/0092213 A1     Mar. 29, 2018

Related U.S. Application Data

(60) Provisional application No. 62/399,370, filed on Sep. 24, 2016.

(51) Int. Cl.
*H05K 1/18* (2006.01)
*H05K 1/14* (2006.01)
(Continued)

(52) U.S. Cl.
CPC .......... *H05K 1/181* (2013.01); *H05K 1/0298* (2013.01); *H05K 1/115* (2013.01); *H05K 1/144* (2013.01);
(Continued)

(58) Field of Classification Search
USPC ........................................................ 361/764
See application file for complete search history.

(56) References Cited

U.S. PATENT DOCUMENTS

| 7,435,619 B2 | 10/2008 | Shim et al. |
| 8,836,136 B2 | 9/2014 | Chau et al. |

(Continued)

FOREIGN PATENT DOCUMENTS

| CN | 101197354 A | 6/2008 |
| CN | 104640350 A | 5/2015 |
| KR | 20090054390 A | 5/2009 |

OTHER PUBLICATIONS

Chinese Office Action for Chinese Application No. 201710876088.7 dated Jul. 12, 2019; 8 pgs.

*Primary Examiner* — Andargie M Aychillhum
(74) *Attorney, Agent, or Firm* — Fletcher Yoder PC

(57) ABSTRACT

The present disclosure is related to printed circuit board packages and methods of assembly that may be used in the fabrication of electrical devices. Printed circuit board packages may be manufactured by stacking printed circuit board assemblies. Each printed circuit board assembly may have multiple printed circuit boards supported by a resin mold. The printed circuit board assemblies may be shaped to improve space utilization efficiency and to accommodate large electrical components that are attached to the printed circuit board package.

16 Claims, 10 Drawing Sheets

(51) Int. Cl.
  *H05K 1/02* (2006.01)
  *H05K 1/11* (2006.01)
  *H05K 3/00* (2006.01)
  *H05K 3/34* (2006.01)
  *H05K 3/28* (2006.01)

(52) U.S. Cl.
  CPC ............ *H05K 3/0014* (2013.01); *H05K 3/341* (2013.01); *H05K 1/113* (2013.01); *H05K 3/284* (2013.01); *H05K 3/3436* (2013.01); *H05K 2201/10159* (2013.01); *H05K 2201/10674* (2013.01); *H05K 2203/1316* (2013.01); *Y02P 70/611* (2015.11)

(56) References Cited

U.S. PATENT DOCUMENTS

| | | |
|---|---|---|
| 2005/0121764 A1 | 6/2005 | Mallik et al. |
| 2007/0108581 A1 | 5/2007 | Shim et al. |
| 2009/0057864 A1 | 3/2009 | Choi et al. |
| 2009/0135575 A1 | 5/2009 | Kajiki et al. |
| 2012/0002455 A1* | 1/2012 | Sullivan .................... G06F 1/10 365/51 |
| 2012/0074595 A1 | 3/2012 | Ha et al. |
| 2014/0054797 A1 | 2/2014 | Gong et al. |
| 2015/0359100 A1 | 12/2015 | Zhao et al. |
| 2017/0098634 A1* | 4/2017 | Kumar .................... H04W 4/80 |

\* cited by examiner

STACKED PRINTED CIRCUIT BOARD PACKAGES

CROSS REFERENCE TO RELATED APPLICATIONS

This application is a Non-Provisional patent application of U.S. Provisional Patent Application No. 62/399,370, entitled "Stacked Printed Circuit Board Packages", filed Sep. 24, 2016, which is herein incorporated by reference in its entirety and for all purposes.

BACKGROUND

The present disclosure relates generally to printed circuit boards for electrical devices. More specifically, this disclosure describes printed circuit board designs that allow stacking of multiple packages for a three-dimensional multi-layer printed circuit board structure.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Electrical devices may employ electrical circuits that are implemented as integrated circuits and discrete components attached to printed circuit boards. Printed circuit boards are often flat structures that may present pads and terminals for the fixation of components. The flat structure of the printed circuit board may impose a constraint to the shape of the electrical device. In some devices, the flat shape of the printed circuit board results in an inefficient use of space in regions located above the printed circuit board.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one example, a printed circuit board assembly is described. The printed circuit board assembly may have a printed circuit board, an integrated circuit coupled to the printed circuit board and a mold fixed to the printed circuit board that embeds the integrated circuit. The mold may have a step down region, i.e., a region of lowered height.

In another example, a printed circuit board stack is described. The printed circuit board stack may a first printed circuit board assembly having a printed circuit board, an integrated circuit, and a mold attached to the printed circuit board that embeds the integrated circuit. The printed circuit board stack also includes a second printed circuit board assembly also having a printed circuit board, an integrated circuit, and a mold attached to the printed circuit board that embed the integrated circuit of the second printed circuit board assembly. The second printed circuit board assembly may also include a thru-mold via (TMV) that electrically couples the printed circuit boards of the first and the second printed circuit board assembly.

Another example provides an example of a method to produce a printed circuit board stack. The method may include processes for producing a set of printed circuit board assemblies having a printed circuit board, an electrical component coupled to the printed circuit board, and a mold attached to the printed circuit board that embeds the electrical component. The method may also include processes for attaching at least one non-embedded electrical component in an exposed surface of the printed circuit board, and for stacking the printed circuit board assemblies.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Many electrical systems include circuitry that may be implemented through the attachment of integrated circuits and passive components to printed circuit boards. Often, the components are attached to a flat printed circuit board. This shape leads to empty volumes in regions located above the components attached to the printed circuit board. In order to obtain compact electrical devices, rearrangements of printed circuit board shapes may allow better utilization of a vertical dimension (i.e., direction perpendicular to a printed circuit board) of the electrical device.

To that end, circuitry may be distributed along multiple stacked printed circuit board assemblies (e.g., a package-on-package structure, or PoP). A printed circuit board assembly (e.g., a system-in-package, or SIP) may include multilayer printed circuit boards and components attached to the printed circuit board, as detailed below. Printed circuit boards assemblies may also have molding materials to encase components and/or provide support to the printed circuit boards. Printed circuit board assemblies may also include vias, such as thru-mold vias, to provide electrical coupling between terminals of the printed circuit boards. Moreover, the printed circuit boards of the printed circuit board assemblies may be multilayer printed circuit boards.

The stacking between printed circuit board assemblies may take place through direct stacking, or through the use of solder balls. In some implementations, a printed circuit board assembly may be multi-height printed circuit board assemblies that present step-down portions, as detailed below. This arrangement may allow creation of space for disposition of components that may have some specific dimensional constraint. Furthermore, in some systems each of the stacked printed circuit board assemblies may be modular printed circuit board assembly. This design may facilitate reutilization of previously designed and manufactured printed circuit board assemblies when a change in a technology may lead to changes in some components of the circuitry.

Figure 1:
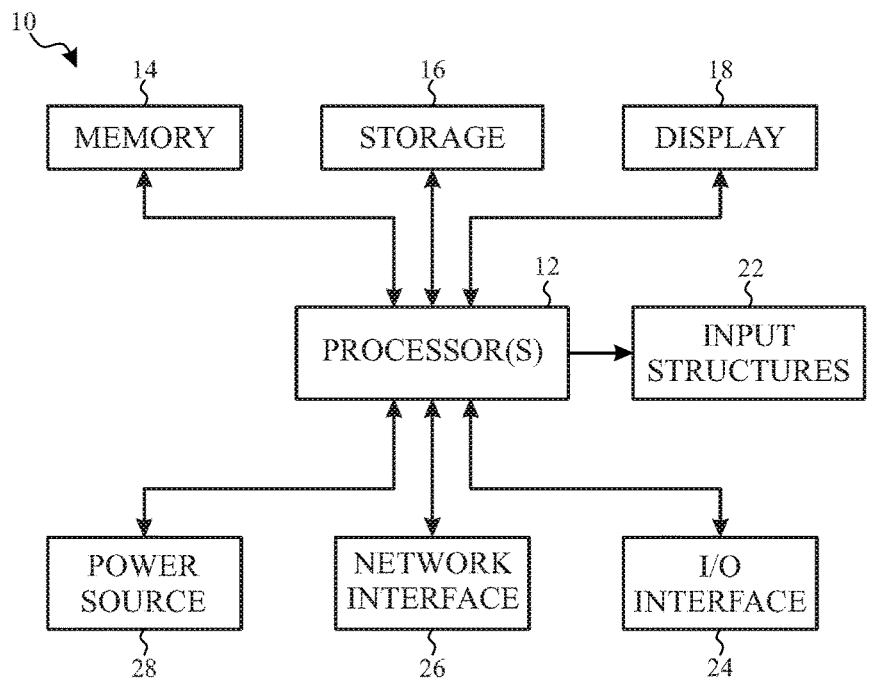
FIG. 1 is a diagram of an electrical device that may benefit from the use of stacked printed circuit board assemblies, in accordance with an embodiment.

With the preceding in mind, a general description of suitable electronic devices that may use the stacked printed circuit board assemblies described above is provided. FIG. 1 is a block diagram of an electronic device 10, in accordance with an embodiment of the present disclosure. The electronic device 10 may include, among other things, one or more processor(s) 12, memory 14, storage or nonvolatile storage 16, a display 18, input structures 22, an input/output (I/O) interface 24, network interface 26, and a power source 28. The various functional blocks shown in FIG. 1 may include hardware elements (including circuitry), software elements (including computer code stored on a computer-readable medium), or a combination of both hardware and software elements. Many of the circuitry of the hardware elements of the various functional blocks of FIG. 1 may employ stacked printed circuit board assemblies to improve the efficiency in space utilization and/or facilitate fabrication of the hardware elements. It should be noted that FIG. 1 is merely one example of a particular implementation and is intended to illustrate the types of components that may be present in electronic device 10.

Figure 2:
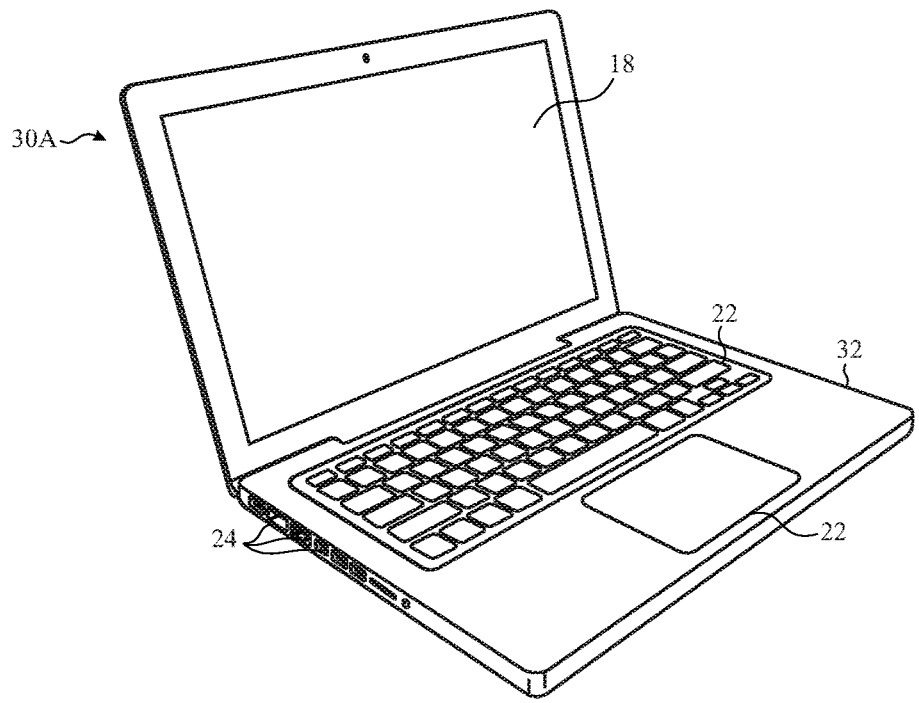
FIG. 2 is a perspective view of a notebook computer that may benefit from the use of stacked printed circuit board assemblies, in accordance with an embodiment.
Figure 3:
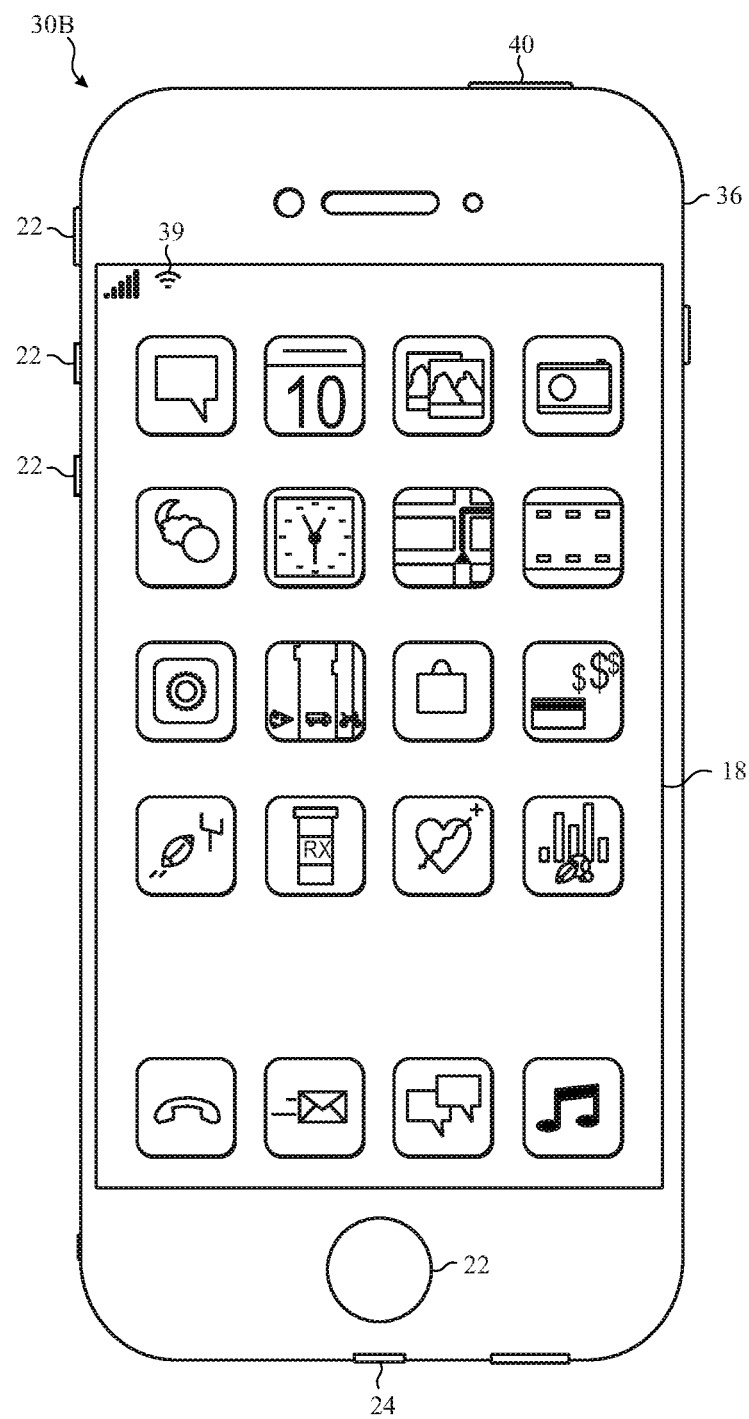
FIG. 3 is a front view of a hand-held device that may benefit from the use of stacked printed circuit board assemblies, in accordance with an embodiment.
Figure 4:
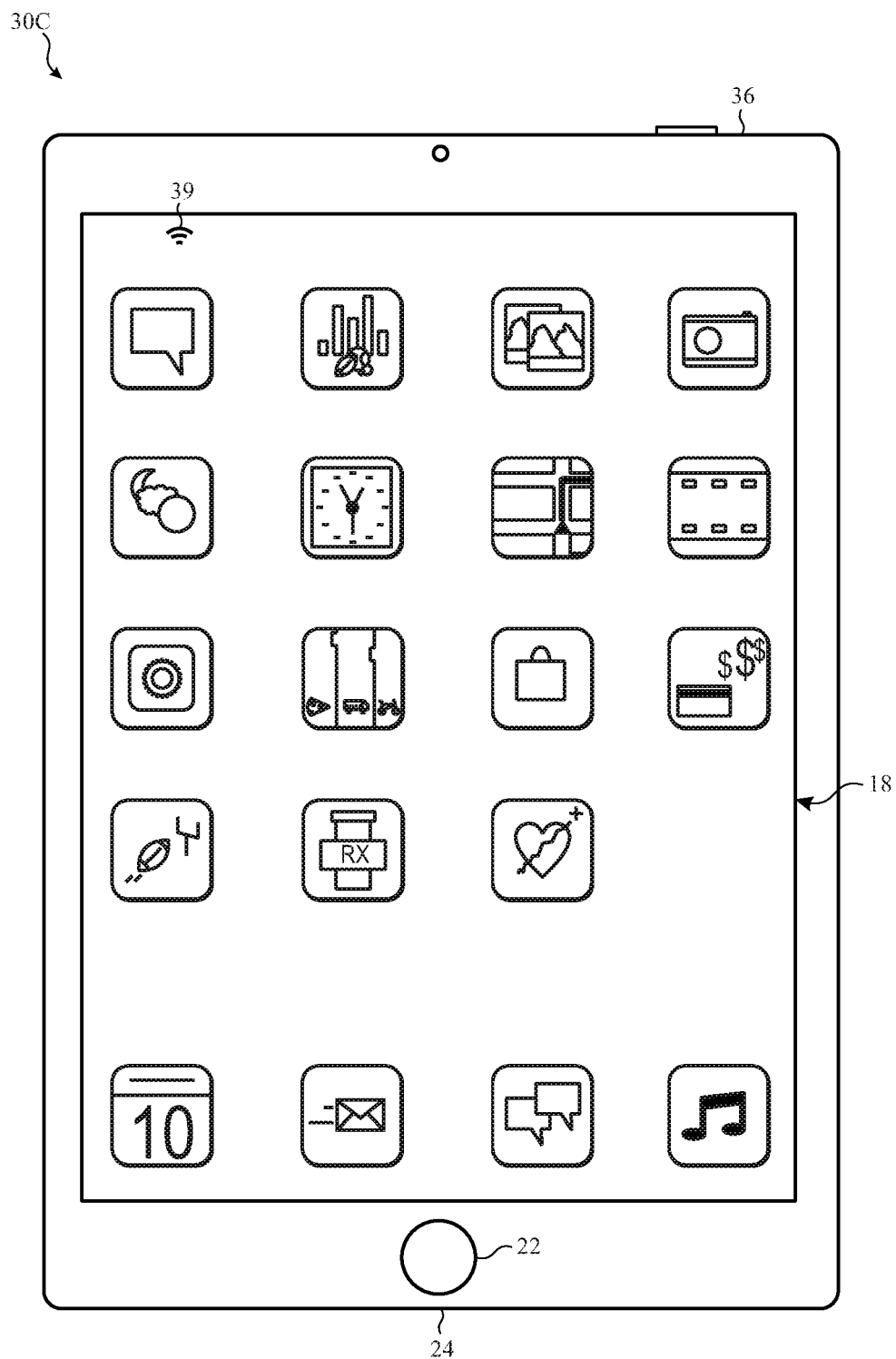
FIG. 4 is a front view of portable tablet computer that may benefit from the use of stacked printed circuit board assemblies, in accordance with an embodiment.
Figure 5:
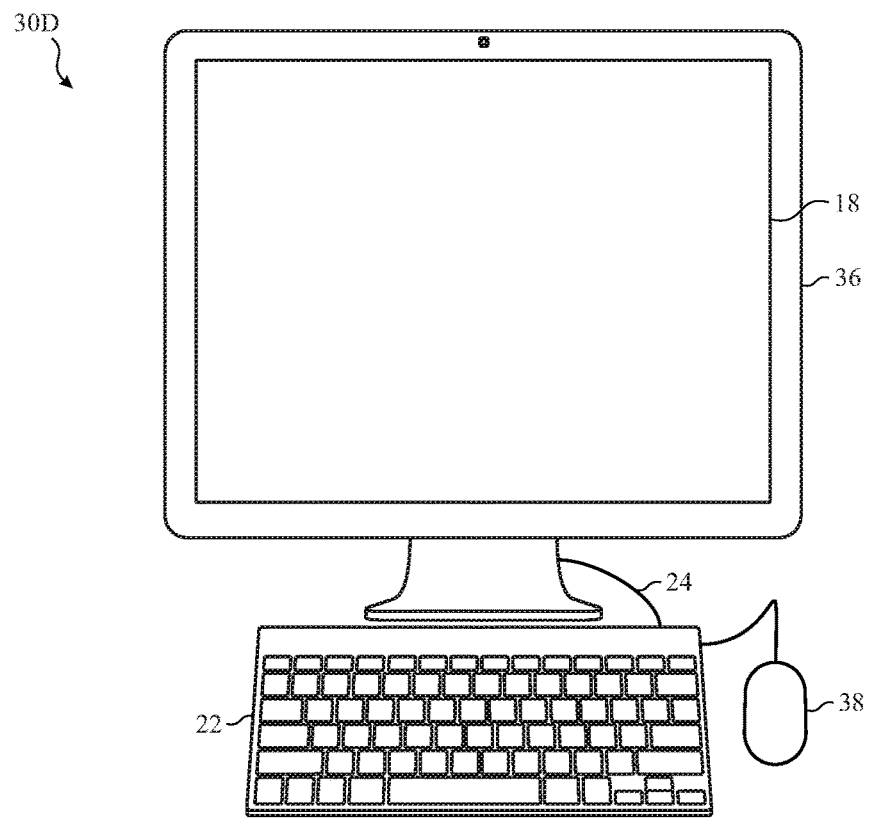
FIG. 5 is a diagram of a desktop computer that may benefit from the use of stacked printed circuit board assemblies, in accordance with an embodiment.
Figure 6:
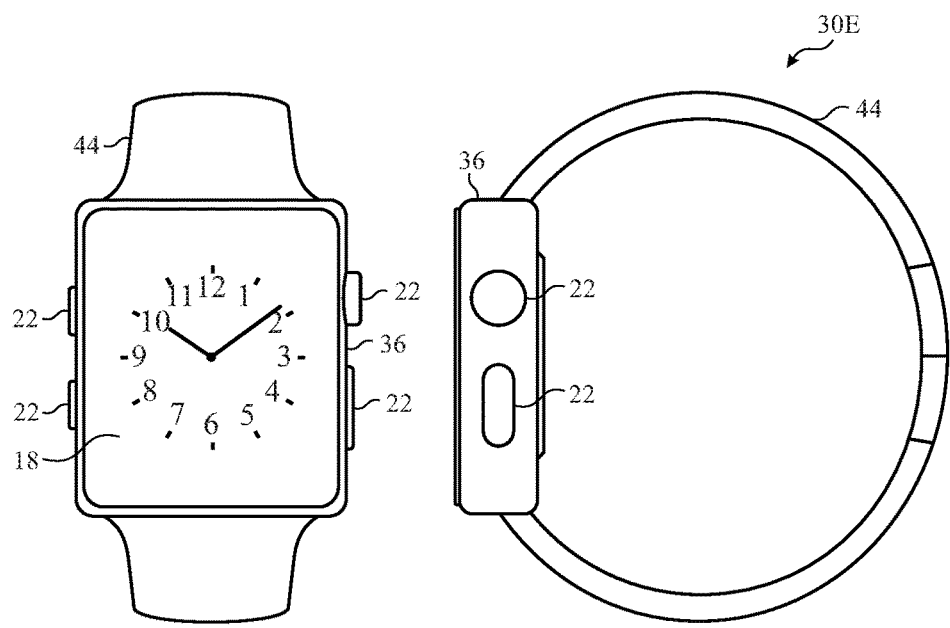
FIG. 6 presents a front and a side view of a wearable electrical device that may benefit from the use of stacked printed circuit board assemblies, in accordance with an embodiment.

By way of example, the electronic device 10 may represent a block diagram of a notebook computer 30A depicted in FIG. 2, handheld devices 30B, 30C depicted in FIG. 3 and FIG. 4, a desktop computer 30D depicted in FIG. 5, a wearable electronic device 30E depicted in FIG. 6, or similar devices. It should be noted that the processor(s) 12 and/or other data processing circuitry may be generally referred to herein as "data processing circuitry." Such data processing circuitry may be embodied wholly or in part as software, firmware, hardware, or any combination thereof. Furthermore, the data processing circuitry may be a single contained processing module or may be incorporated wholly or partially within any of the other elements within the electronic device 10. The data processing circuitry may be implemented using a single printed circuit board assembly, a printed circuit board assembly module, or distributed across multiple printed circuit board assemblies of a printed circuit board stack system.

In the electronic device 10 of FIG. 1, the processor(s) 12 and/or other data processing circuitry may be operably coupled with the memory 14 and the nonvolatile storage 16 to perform various algorithms. Such programs or instructions executed by the processor(s) 12 may be stored in any suitable article of manufacture or computer program product that includes one or more tangible, computer-readable media at least collectively storing the instructions or routines, such as the memory 14 and the nonvolatile storage 16. The memory 14 and the nonvolatile storage 16 may include any suitable articles of manufacture for storing data and executable instructions, such as random-access memory, read-only memory, rewritable flash memory, hard drives, and optical discs. Moreover, programs (e.g., an operating system) encoded on the memory 14 or the nonvolatile storage 16 may also include instructions that may be executed by the processor(s) 12 to allow the electronic device 10 to provide various functionalities. A printed circuit board stack may include multiple functional blocks. In some implementation, a printed circuit board assembly may include one or multiple functional blocks, as detailed below.

In certain embodiments, the display 18 may be a liquid crystal display (e.g., LCD), which may allow users to view images generated on the electronic device 10. In some embodiments, the display 18 may include a touch screen, which may allow users to interact with a user interface of the electronic device 10. Furthermore, it should be appreciated that, in some embodiments, the display 18 may include one or more light emitting diode (e.g., LED, OLED, AMOLED, etc.) displays, or some combination of LCD panels and LED panels.

The input structures 22 of the electronic device 10 may allow a user to interact with the electronic device 10 (e.g., pressing a button to increase or decrease a volume level). The I/O interface 24 may allow electronic device 10 to interface with various other electronic devices. The I/O interface 24 may include various communications interfaces, such as universal serial bus (USB) ports, serial communications ports (e.g., RS232), Apple's Lightning® connector, or other communications interfaces. The network interface 26 may also allow electronic device 10 to interface with various other electronic devices and may include, for example, interfaces for a personal area network (e.g., PAN), such as a Bluetooth network, for a local area network (e.g., LAN) or wireless local area network (e.g., WLAN), such as an 802.11x Wi-Fi network, and/or for a wide area network (e.g., WAN), such as a 3rd generation (e.g., 3G) cellular network, 4th generation (e.g., 4G) cellular network, or long term evolution (e.g., LTE) cellular network. The network interface 26 may include an interface for, for example, broadband fixed wireless access networks (e.g., WiMAX), mobile broadband Wireless networks (e.g., mobile WiMAX), asynchronous digital subscriber lines (e.g., ADSL, VDSL), digital video broadcasting-terrestrial (DVB-T) and its extension DVB Handheld (DVB-H), Ultra-Wideband (UWB), alternating current (AC) power lines, and so forth.

In some applications, input structures 22, the I/O interfaces 24 and/or network interfaces 26 may employ radiofrequency (RF) circuitry modules. As further illustrated, the electronic device 10 may include a power source 28. The power source 28 may include any suitable source of power, such as a rechargeable lithium polymer (e.g., Li-poly) battery and/or an alternating current (e.g., AC) power converter. The power source 28 may be removable, such as replaceable battery cell.

In certain embodiments, the electronic device 10 may take the form of a computer, a portable electronic device, a wearable electronic device, or other type of electronic device. Such computers may include computers that are generally portable (e.g., such as laptop, notebook, and tablet computers) as well as computers that are generally used in one place (e.g., such as conventional desktop computers, workstations and/or servers). In certain embodiments, the electronic device 10 in the form of a computer may be a model of a MacBook®, MacBook® Pro, MacBook Air®, iMac®, Mac® mini, or Mac Pro® available from Apple Inc. By way of example, the electronic device 10, taking the form of the notebook computer 30A, is illustrated in FIG. 2 in accordance with an embodiment of the present disclosure. The depicted computer 30A may include a housing or enclosure 32, a display 18, input structures 22, and ports of the I/O interface 24. In one embodiment, the input structures 22 (e.g., such as a keyboard and/or touchpad) may be used to interact with the computer 30A, such as to start, control, or operate a GUI or applications running on computer 30A. For example, a keyboard and/or touchpad may allow a user to navigate a user interface or application interface displayed on display 18.

FIG. 3 depicts a front view of a handheld device 30B, which represents an embodiment of the electronic device 10. The handheld device 30B may represent, for example, a portable phone, a media player, a personal data organizer, a handheld game platform, or any combination of such devices. By way of example, the handheld device 30B may be a model of an iPod® or iPhone® available from Apple Inc. of Cupertino, Calif. FIG. 4 depicts a front view of another handheld device 30C, which represents another embodiment of the electronic device 10. The handheld device 30C may represent, for example, a tablet computer, or one of various portable computing devices. By way of example, the handheld device 30C may be a tablet-sized embodiment of the electronic device 10, which may be, for example, a model of an iPad® available from Apple Inc. of Cupertino, Calif.

The handheld devices 30B and 30C may each include similar components. For example, an enclosure 36 may protect interior components from physical damage. Enclosure 36 may also shield the handheld devices 30B and 30C from electromagnetic interference. The enclosure 36 may surround the display 18, which may display indicator icons 39. The indicator icons 39 may indicate, among other things, a cellular signal strength, Bluetooth connection, and/or battery life. The I/O interfaces 24 may open through the enclosure 36 and may include, for example, an I/O port for a hard wired connection for charging and/or content manipulation using a connector and protocol, such as the Lightning connector provided by Apple Inc., a universal service bus (e.g., USB), one or more conducted radio frequency connectors, or other connectors and protocols.

User input structures 22, 40, in combination with the display 18, may allow a user to control the handheld devices 30B or 30C. For example, the input structure 40 may activate or deactivate the handheld device 30B or 30C, one of the input structures 22 may navigate a user interface of the handheld device 30B or 30C to a home screen, a user-configurable application screen, and/or activate a voice-recognition feature of the handheld device 30B or 30C, while other of the input structures 22 may provide volume control, or may toggle between vibrate and ring modes. In the case of the handheld device 30B, additional input structures 22 may also include a microphone may obtain a user's voice for various voice-related features, and a speaker to allow for audio playback and/or certain phone capabilities. Portable devices 30B and 30C may include stacked printed circuit board assemblies described herein to improve the efficiency in space utilization.

Turning to FIG. 5, a computer 30D may represent another embodiment of the electronic device 10 of FIG. 1. The computer 30D may take any suitable form of computer, such as a desktop computer, a server, or a notebook computer, but may also be a standalone media player or video gaming machine. By way of example, the computer 30D may be an iMac®, a MacBook®, or other similar device by Apple Inc. It should be noted that the computer 30D may also represent a personal computer (e.g., PC) by another manufacturer. A similar enclosure 36 may be provided to protect and enclose internal components of the computer 30D such as a dual-layer display. In certain embodiments, a user of the computer 30D may interact with the computer 30D using various peripheral input devices, such as input structures 22 (e.g., the keyboard or mouse 38), which may connect to the computer 30D via a wired I/O interface 24 and/or wireless I/O interface.

Similarly, FIG. 6 depicts a wearable electronic device 30E representing another embodiment of the electronic device 10 of FIG. 1 that may be configured to operate using the techniques described herein. By way of example, the wearable electronic device 30E, which may include a wristband 44, may be an Apple Watch® by Apple, Inc. However, in other embodiments, the wearable electronic device 30E may include any wearable electronic device such as, for example, a wearable exercise monitoring device (e.g., pedometer, accelerometer, heart rate monitor), or other device by another manufacturer. The display 18 of the wearable electronic device 30E may include a touch screen (e.g., LCD, OLED display, active-matrix organic light emitting diode (e.g., AMOLED) display, and so forth), which may allow users to interact with a user interface of the wearable electronic device 30E.

Figure 7:
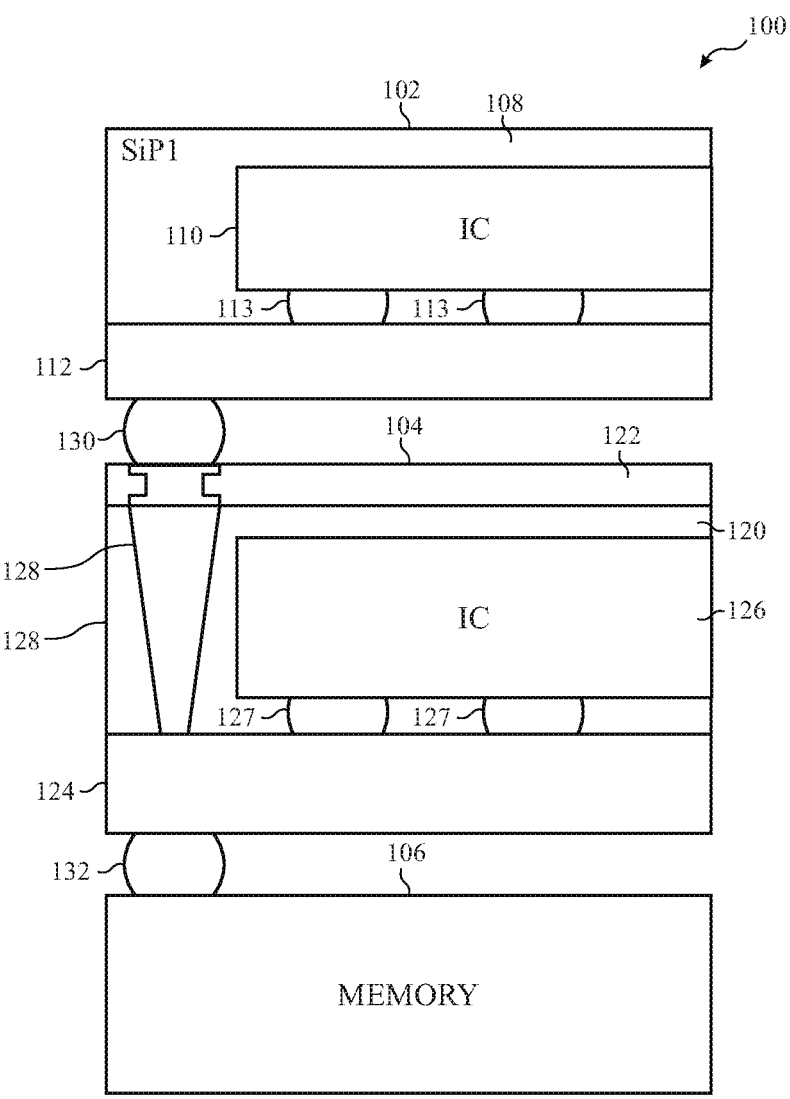
FIG. 7 presents a printed circuit board stack having two printed circuit board assemblies and an electrical component, in accordance with an embodiment.

With the foregoing in mind, FIG. 7 illustrates a printed circuit board stack 100. The printed circuit board stack 100 includes a top printed circuit board assembly 102 and a middle printed circuit board assembly 104. The printed circuit board stack 100 may also include a memory component 106, which may be a NAND memory device. Other printed circuit board assemblies, integrated circuits or other non-embedded electrical components may be used instead of the memory component 106 in a printed circuit board stack 100.

Printed circuit board assembly 102 may include a mold 108 that encapsulates an integrated circuit 110 and may sit above multilayer printed circuit board 112. Integrated circuit 110 may also be electrically coupled to the multilayer printed circuit board 112 with a solder ball 113. As another example, printed circuit board assembly 104 may include a mold 120 displaced between a top printed circuit board 122 and a bottom printed circuit board 124. The top printed circuit board 122 may also be a redistribution layer. Mold 120 is also encasing an integrated circuit 126, which is soldered to the bottom printed circuit board 124 with solder balls 127. A thru-mold via (TMV) 128 may also be embedded within the mold 120 to provide coupling between the top printed circuit board 122 and the bottom printed circuit board 124.

A solder ball 130 may couple the top printed circuit board assembly 102 to the middle printed circuit board assembly 104. In the example, solder ball 130 couples the multilayer printed circuit board 112 and the top printed circuit board 122. As detailed below, the solder ball 130 may be placed above a pad of the TMV 128 to provide an electrical circuit route between the multilayer printed circuit board 112 and the bottom printed circuit board 124.

It should be understood that the TMV 128 may provide other circuit routes for the middle printed circuit board assembly 104 to couple printed circuit boards in a printed circuit board stack 100. For example, solder ball 132 may be used to couple the memory component 106 to the middle printed circuit board assembly 104, and the TMV 128 may be used to provide an electrical connection between the multilayer printed circuit board 112 and the memory component 106.

The printed circuit boards 112, 122 and 124 illustrated in the example an in the other examples illustrated herein may be multilayer printed circuit boards. In some examples, these printed circuit boards may be assembled as redistribution layers of the circuit. For example, a printed circuit board may be used to provide connection between multiple printed circuit board assemblies, as detailed below.

Figure 8:
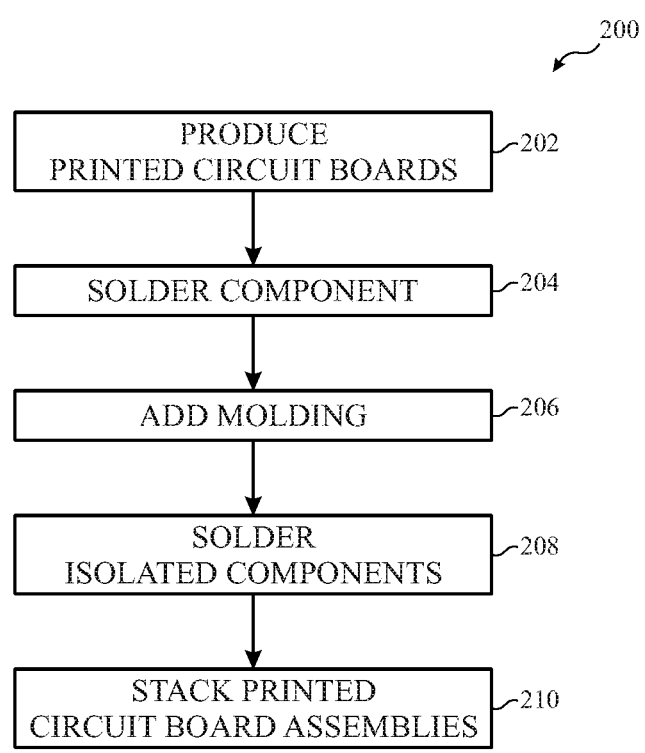
FIG. 8 presents a method to produce a printed circuit board stack as the one in FIG. 7, in accordance with an embodiment.
Figure 9:
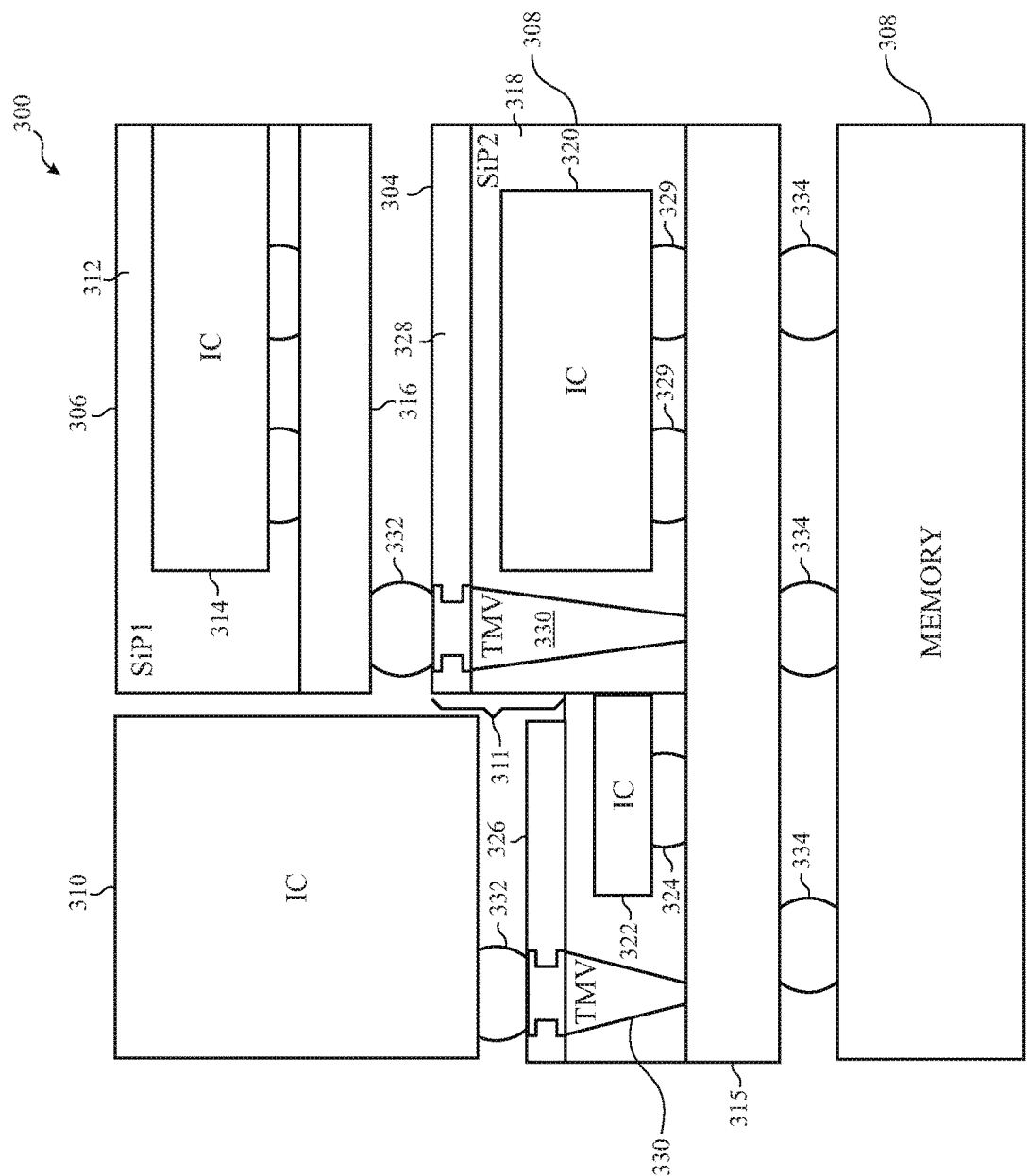
FIG. 9 presents a printed circuit board stack with a printed circuit board assembly having a step down region, in accordance with an embodiment.

The flow chart 200 of FIG. 8 illustrates a method to produce stacked printed circuit board assemblies as the ones described herein. A process to produce the printed circuit boards that may be in the top or the bottom of each of the printed circuit board assemblies (box 202). The printed circuit boards may be redistribution layers and may have routes and pads, as detailed below. Components that are embedded within a molding material may be soldered to the printed circuit boards (box 204).

Printed circuit boards may then be attached to mold (box 206). In some implementations, the mold may be a cured resin or rubber that is affixed to the printed circuit boards. In other implementations, the molding may take place by solidification of a liquid, resin or a gel that may be placed on the top of printed circuit board. The liquid, resin, or gel may then be cured in place to produce the mold. In some implementations, a step down region in the mold may be produced through carving, cutting or may be obtained through curing in place. The addition of mold (box 206) may produce printed circuit board assemblies, as described herein.

After the addition of the mold (box 206), components that are not embedded in the mold may be soldered (box 208) to the exposed surfaces of the printed circuit boards to produce printed circuit board assemblies that are ready for stacking. In some implementations, as discussed herein, a printed circuit board assembly may include one or more self-contained functional modules, as described above. The printed circuit board assemblies may be stacked (box 210) to produce a printed circuit board stack. The stacking may employ the use of solder balls, soldering of exposed pins of the printed circuit boards, wires, or any other appropriate method as specified in the design of the printed circuit board stack.

The printed circuit board stack 300 of FIG. 8 provides another illustration of a packaging that uses multiple printed circuit board assemblies 304 and 306. The printed circuit board stack may also be coupled to memory component 308 and an integrated circuit 310. The memory component 308 may be for example, a NAND memory integrated circuit and the integrated circuit 310 may be, for example, a memory integrated circuit. In some implementations, integrated circuit 310 may be an adaptor for an integrated circuit such as a slot for a subscriber identification module (SIM) card for a mobile device, or a slot for removable flash memory. Note that the integrated circuit 310 is not embedded in the mold, and may be soldered to an exposed surface (e.g., a surface not attached to the mold).

Note that, in the example illustrated, integrated circuit 310 may have a significant height and width that may affect the dimensions of the printed circuit board stack 300. To improve the efficiency in space utilization, the printed circuit assembly 306 may have a width that is smaller than the width of the printed circuit board stack 300. Moreover, printed circuit board assembly 304 may present a step down region 311 to accommodate the dimensions of integrated circuit 310. Materials in the step down region 311 may include mechanical components to reduce vibration, provide stiffness, or other mechanical advantages. For example, rubbery materials may be provided to add dampening properties, and stiff materials may be used to increase protection. Dielectric materials that may provide self-shielding properties to the regions of the assembly of the electronic device may also be added. Moreover, the step down region 311 may be used to allow air flow for heat dissipation, or addition of materials with thermal properties to facilitate heat dissipation.

Top printed circuit board assembly 306 may have a mold material 312 that encases an integrated circuit 314. The integrated circuit 314 may employ solder balls 315 for coupling with printed circuit board 316 of the printed circuit board assembly 306. The middle printed circuit board assembly 304 may have a mold 318 enveloping integrated circuits 320 and 322. Integrated circuits 320 and 322 may be soldered to a lower printed circuit board 325. The mold 318 is disposed on top of lower printed circuit board 325 and provides support for printed circuit boards 326 and 328. Note that printed circuit board 326 is located in the step down region 311, as discussed below.

The step down region 311 may be produced by having a mold 318 with the appropriate shape with a step down structure. Printed circuit board 326 may be placed in the top of mold 318 in the step down region and printed circuit board 328 may be placed in the step down region 311, and printed circuit board 328 may be placed in the top of mold 318 in the elevated region to generate the printed circuit board assembly 304 with the step down region 311.

In this illustration of an example of a printed circuit board assembly 304, TMVs 330 may be used to be couple the bottom printed circuit board 315 to top printed circuit boards 326 and 328. As discussed above, the TMVs 330 may be employed to route electrical circuit across electrical circuit components and integrated circuits of the printed circuit board stack. Note that solder balls 332 and 334 may be used to provide electrical coupling between the multiple modules of the printed circuit board stack 300, such as printed circuit board assemblies 304 and 306, integrated circuit 310 and memory component 308.

Figure 10:
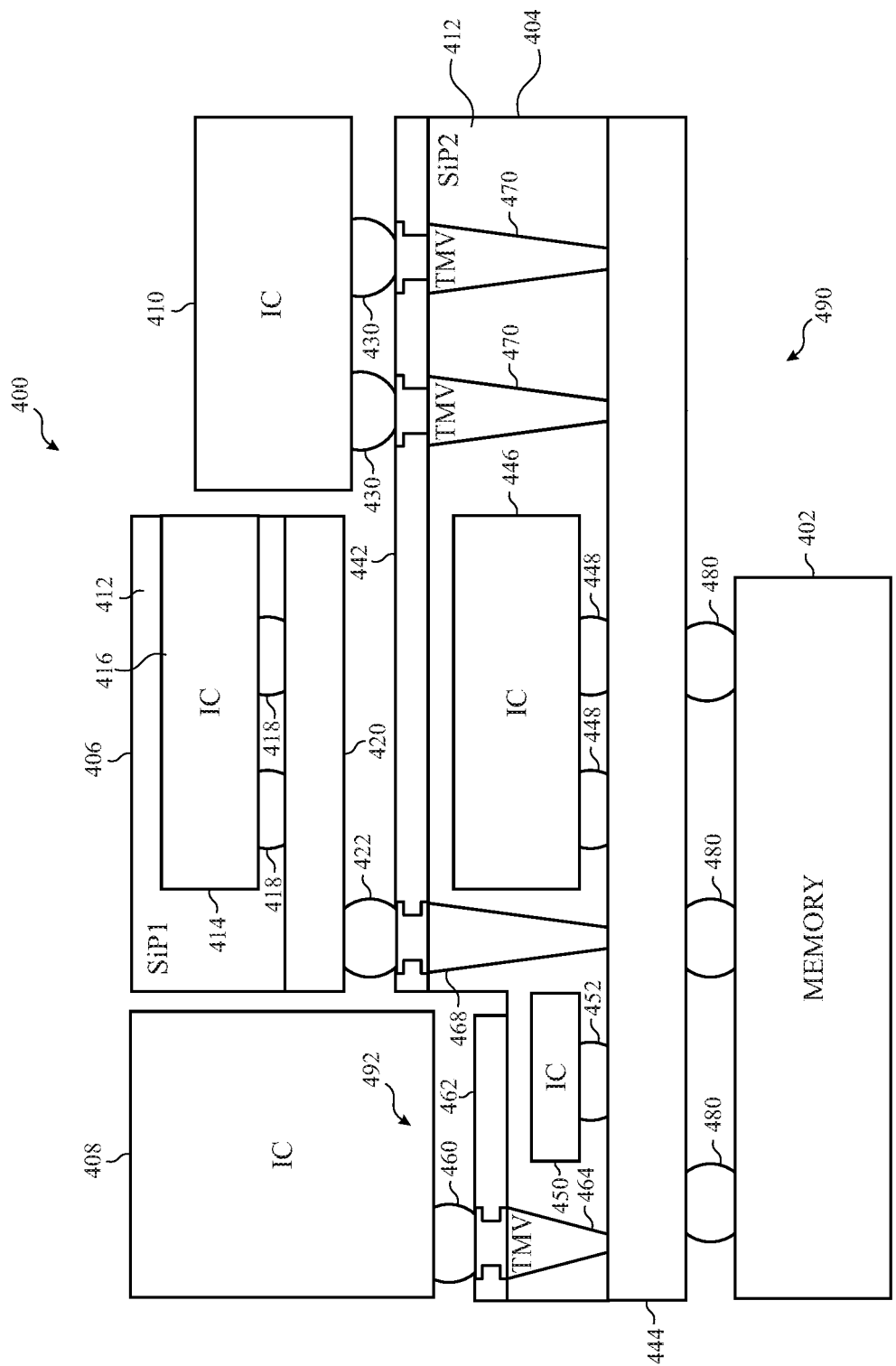
FIG. 10 presents another example of a printed circuit board stack with a printed circuit board assembly having a step down region, in accordance with an embodiment.

The printed circuit board stack 400 illustrated in FIG. 10 provides another example of increased space utilization efficiency. In this system, printed circuit board assembly 404 is attached to the multiple modules of the printed circuit board stack, each module having a distinct shape. For example, memory component 402 may have a width that is shorter than the printed circuit board assembly, which may leave a region 490 that may be use for a casing of an electrical device. Moreover, a printed circuit board assembly 406 may be attached to the top of printed circuit board assembly 404. Integrated circuits 408 and 410 may also be attached to the top of printed circuit board assembly 404. Note that integrated circuit 408 may have a height that is larger than that of printed circuit board assembly 406 and integrated circuit 410. To accommodate this height difference, printed circuit board assembly 404 may have a step down region 492, similar to the one described above.

The printed circuit board assembly 406 may have a mold 412 encapsulating an integrated circuit 414 that may be soldered to a bottom printed circuit board 420 via solder balls 418. Similar, printed circuit board assembly 404 may have a mold 412 disposed between top printed circuit boards 442 and 462, and a bottom printed circuit board 444. Integrated circuit 446 may be electrically coupled to the bottom printed circuit board 444 through solder balls 448, and integrated circuit 450 may be electrically coupled to the bottom printed circuit board 444 through solder ball 452. Printed circuit board assembly 406 may also have TMVs 464 that couple top printed circuit boards 442 and 462 to bottom printed circuit board 444. As mentioned above, TMVs 464 may be used to provide routing between the multiple integrated circuits and discrete components of the printed circuit board stack 400.

The multiple modules of the printed circuit board stack 400 may be connected via solder balls. For example, integrated circuit 408 may be electrically coupled to top printed circuit board 462 via solder ball 460 and integrated circuit 410 may be coupled to printed circuit board 442 through solder balls 430. Printed circuit board assembly 406 may be coupled to printed circuit board assembly 404 via solder ball 422. The memory component 402 may be coupled to the bottom printed circuit board 444 of the printed circuit board assembly 404 using solder balls 480. It should be noted that other methods may be used such as attaching wires or using metallic terminations (e.g., pins) for these attachments.

Note that integrated circuit 410 is directly attached to the top of printed circuit board 442, whereas integrated circuit 416 is electrically coupled to printed circuit board 442 through at least printed circuit board 420. This may be useful in situations where integrated circuit 416 may benefit from a shielding. This shielding may be provided by dielectric properties of mold 412, or by a shielding from the printed circuit board 420. Shielding may also be provided by additional structures added to printed circuit board assembly 406. An integrated circuit 410 that may be self-shielded can be soldered directly to printed circuit board 442.

As described above, different printed circuit board assemblies may be functional units. For example, printed circuit board assembly 404 may be a processing module of the printed circuit board stack 400. In this example, integrated circuit 446 may be a processor or a system-on-a-chip and integrated circuit 450 may include a cache memory. Further, printed circuit board assembly 406 may be a network controller module of the printed circuit board stack 400 and integrated circuit 414 may further be a network controller chip. In this illustration, integrated circuit 410 may include a controller for an input/output device, and integrated circuit 408 may be an adaptor for a removable flash memory card. In this example, a change in the specification of the network adaptor may be accommodated by changes in the printed circuit board assembly 406, without changing the remaining components of the printed circuit board stack 400.

Figure 11:
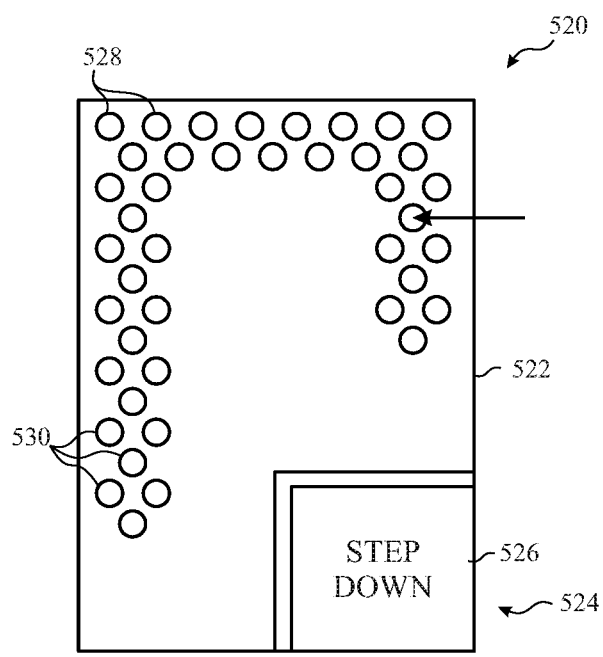
FIG. 11 is a top diagram of a printed circuit board assembly illustrating having a step down region, in accordance with an embodiment.

As mentioned above, a printed circuit board assembly may have multiple thru-mold vias (TMV) for electrical coupling between modules and components of stacked printed circuit board assemblies. FIG. 11 is a top diagram of a printed circuit board assembly having a step down region. Top view 520 provides an example of the printed circuit board assembly. Top printed circuit boards 522, as well as a step down region 524 having a second printed circuit board 526, are illustrated. Note that top printed circuit board 522 may include TMV solder pads 528, which are exposed electrical terminations for the TMVs of the printed circuit board assembly, as discussed above. Note also that the top printed circuit board 522 may also have electrical pads 530, which are not directly coupled to TMVs and may be used for redistribution of connections in a redistribution layer.

Figure 12:
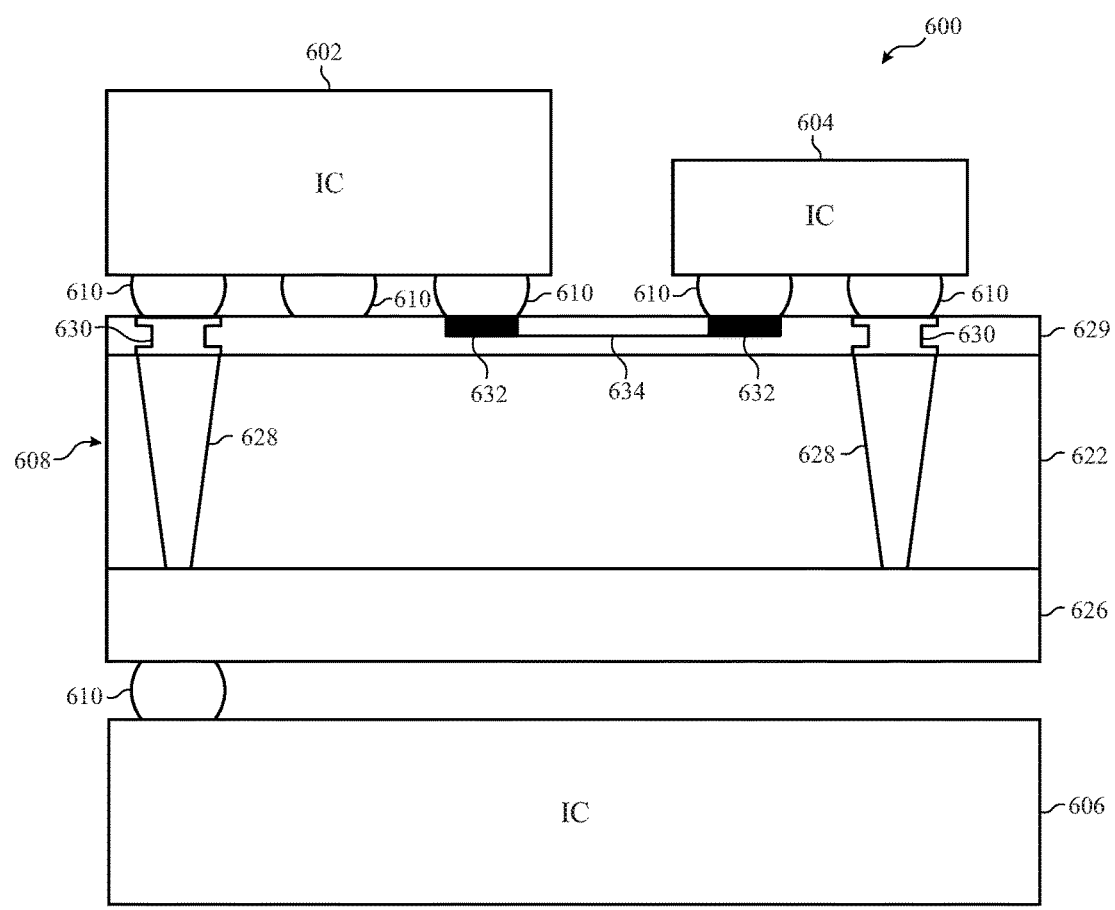
FIG. 12 is a diagram of a printed circuit board assembly illustrating examples of routing strategies within a printed circuit board stack, in accordance with an embodiment.

The printed circuit board stack 600 of FIG. 12 illustrates another example of the systems described herein. In this example, a single printed circuit board assembly 608 may be electrically coupled to integrated circuits 602, 604 and 606. Printed circuit board assembly 608 may include a mold 622 disposed between a top printed circuit board 624 and bottom printed circuit board 626. Printed circuit board assembly 608 may also include TMVs 628 with TMV solder pads 630 in the top printed circuit board 624. Top printed circuit board 624 may also have electrical pads 632 which, in this example are coupled through a route 634. Electrical pads 632 and route 634 may create an electrical circuit between integrated circuit 602 and integrated circuit 604 through the top printed circuit board 624. Note that another route between integrated circuits 602 and 604 may be made through TMV 628 and bottom printed circuit board 626 (not illustrated in this diagram).

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A printed circuit board assembly comprising:
a first bottom printed circuit board;
an integrated circuit electrically coupled to the first bottom printed circuit board;
a mold embedding the integrated circuit and attached to the first bottom printed circuit board at a bottom surface of the mold, wherein the mold comprises a first portion having a first height measured from the bottom surface to a first top surface of the mold, and a second portion having a second height measured from the bottom surface to a second top surface of the mold, wherein the second height is smaller than the first height;

a first top printed circuit board attached to the mold in the first surface; and a second top printed circuit board attached to the mold in the second surface of the mold.

2. The printed circuit board assembly of claim 1, comprising a thru-mold via.

3. The printed circuit board assembly of claim 1, wherein the integrated circuit is electrically coupled to the bottom printed circuit board using a solder ball.

4. The printed circuit board assembly of claim 1, wherein the bottom printed circuit board comprises a multilayer printed circuit board.

5. The printed circuit board assembly of claim 1, wherein the integrated circuit comprises a system-on-a-chip.

6. A printed circuit board stack comprising:
   a first printed circuit board assembly comprising:
      a first printed circuit board;
      a first integrated circuit electrically coupled to the first printed circuit board; and
      a first mold embedding the first integrated circuit and attached to the first printed circuit board; and
   a second printed circuit board assembly comprising:
      a bottom printed circuit board;
      a second integrated circuit electrically coupled to the bottom printed circuit board;
      a second mold embedding the second integrated circuit and attached to the bottom printed circuit board, wherein the second mold comprises a first region having a first height and a second region having a second height smaller than the first height;
      a first top printed circuit board attached to the second mold in the first region;
      a second top printed circuit board attached to the second mold in the second region; and
      a thru-mold via embedded in the second mold and configured to electrically couple the first printed circuit board of the first printed circuit board assembly and the bottom printed circuit board of the second printed circuit board assembly through the first top printed circuit board.

7. The printed circuit board stack of claim 6, wherein the first top printed circuit board assembly comprises a solder pad of the thru-mold via.

8. The printed circuit board stack of claim 7, comprising a solder ball configured to electrically couple the first top printed circuit board and the solder pad of the thru-mold via.

9. The printed circuit board stack of claim 7, comprising an electrical component soldered to the second top printed circuit board, wherein the electrical component is not embedded by the second mold or the first mold.

10. The printed circuit board stack of claim 6, comprising an electrical component soldered to a bottom surface of the bottom printed circuit board opposite to top a surface of the bottom printed circuit board attached to the second mold.

11. The printed circuit board stack of claim 10, wherein the electrical component is a memory component.

12. The printed circuit board stack of claim 6, wherein the first integrated circuit comprises a network controller and the second integrated circuit comprises a system-on-chip.

13. The printed circuit board stack of claim 6, comprising a second printed circuit board attached to the second top printed circuit board of the second printed circuit board assembly.

14. The printed circuit board stack of claim 13, comprising a removable integrated circuit adaptor attached to the second printed circuit board.

15. A method to produce an electrical device, comprising:
   providing set of printed circuit board assemblies, wherein at least one printed circuit board assembly comprises:
      a bottom printed circuit board;
      an electrical component coupled to the printed circuit board;
      a mold embedding the electrical component and attached to the printed circuit board in a bottom surface of the mold, wherein the mold comprises a first region that has a first height and a second region that has a second height smaller than the first height;
      a first top printed circuit board attached to the mold in the first region in a first top surface that is opposite to the bottom surface of the mold; and
      a second top printed circuit board attached to the mold in the second region in a second top surface that is opposite to the bottom surface of the mold; and
   attaching at least one non-embedded electrical component in an exposed surface of a top printed circuit board of the at least one printed circuit board assembly, wherein the top printed circuit board is disposed in the second region; and
   stack the set of printed circuit board assemblies.

16. The method of claim 15, wherein the top printed circuit board comprises a removable integrated circuit adaptor configured to receive the at least one non-embedded electrical component.

* * * * *

UNITED STATES PATENT AND TRADEMARK OFFICE
CERTIFICATE OF CORRECTION

PATENT NO. : 10,631,410 B2  
APPLICATION NO. : 15/710579  
DATED : April 21, 2020  
INVENTOR(S) : Corey S. Provencher et al.

Page 1 of 1

It is certified that error appears in the above-identified patent and that said Letters Patent is hereby corrected as shown below:

In the Claims

In Column 11, Claim 1, Line 2, insert the word --top-- between the words "first" and "surface".

In Column 11, Claim 1, Line 4, insert the word --top-- between the words "second" and "surface".

In Column 11, Claim 3, Line 8, insert the word --first-- between the words "the" and "bottom".

In Column 11, Claim 4, Line 11, insert the word --first-- between the words "the" and "bottom".

In Column 11, Claim 7, Line 42, delete the word "assembly".

In Column 12, Claim 10, Line 5, replace the phrase "to top a surface" with --a surface to top--.

In Column 12, Claim 15, Line 24, insert --at least one-- between "the" and "printed";
        Line 27, insert --at least one-- between "the" and "printed"; and
        Line 43, replace "stack" with --stacking--.

Signed and Sealed this
Fifteenth Day of December, 2020

Andrei Iancu
*Director of the United States Patent and Trademark Office*